HIGH GAIN A.G.C. SYSTEM FOR TRANSISTOR I.F. SYSTEMS

Filed May 29, 1963

INVENTOR
CLARENCE BAINUM

BY R. J. Tompkins

ATTORNEY 3,309,611
Patented Mar. 14, 1967

3,309,611

HIGH GAIN A.G.C. SYSTEM FOR TRANSISTOR I.F. SYSTEMS

Clarence Bainum, Alexandria, Va., assignor to the United States of America as represented by the Secretary of the Navy Filed May 29, 1963, Ser. No. 284,270
4 Claims. (Cl. 325—401)

The invention described herein may be manufactured and used by or for the Government of the United States of America for governmental purposes without the payment of any royalties thereon or therefor.

The present invention relates to an automatic gain control, and more particularly to an automatic gain control employing transistors.

In general transistor type automatic gain control circuits have narrow band control and are thereby limited in range, and further require a large input signal to effect the required control.

The present invention requires a small input, while attaining a wide range.

An object of the present invention is the provision of an automatic gain control circuit which can detect weak solar signals above a very low point of noise.

Another object is to provide an automatic gain control having a broad dynamic range starting at the level of solar noise.

A further object of the invention is the provision of an automatic gain control circuit which utilizes cascading transistors having their emitters connected to the emitter of a transistor located in the mixer or I.F. stage.

A final object of the present invention is the provision of an automatic gain control having a wide range, and large power gain requiring a minimum of current.

Other objects and advantages of the invention will hereinafter become more fully apparent from the following description of the annexed drawings, which illustrate a preferred embodiment, and wherein.

Briefly, the invention embodies an automatic gain control circuit used in detecting signal units down to minimum detectable signals, wherein the sensitivity of I.F. stages are established at or below noise level, and are thereafter controlled over a large dynamic range.

Figure 1:
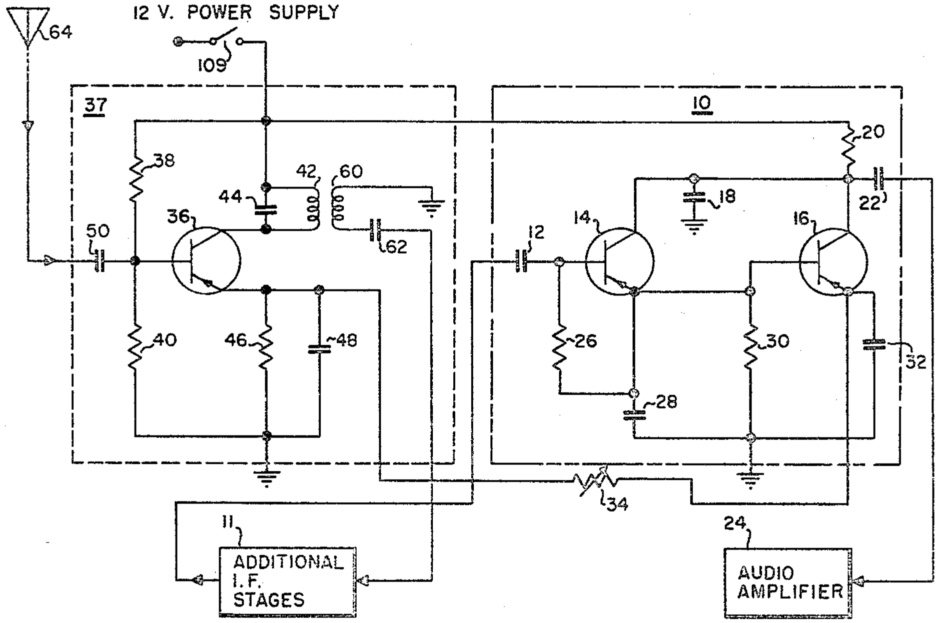
FIG. 1 is a schematic circuit diagram of an automatic gain control circuit embodying the principles of the invention.
Figure 2:
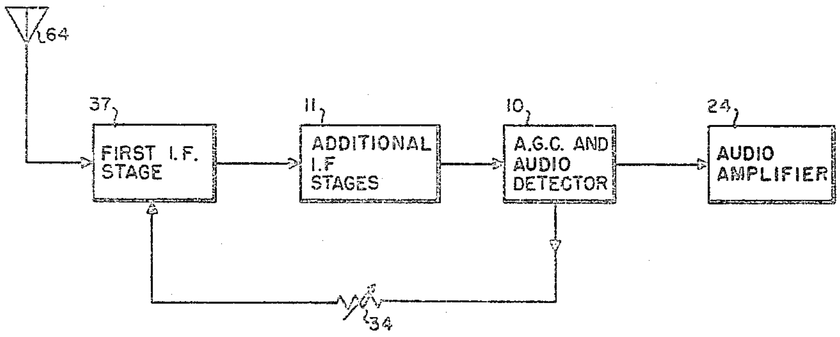
FIG. 2 is a block diagram of the automatic gain control integrated with related units as is employed in the invention.

Referring now to the drawings in detail wherein like reference characters designate like or corresponding parts throughout the several views, there is shown in FIG. 1 an automatic gain control circuit including an input shown as an antenna 64 symbolic of both an antenna and conventional mixing stage connected to the input of the first I.F. stage 37 through a coupling capacitor 50. The major difference between FIGS. 1 and 2 is the detailed schematic of blocks 37 and 10 in FIG. 1. Also, a D.C. power supply is shown connected through switch 109 to first I.F. stage 37.

Beginning at the output of the final I.F. stage shown as block 11, an I.F. coupling capacitor 12 is shown connected to the base of transistor 14. The emitter of transistor 14 is connected to the base of a second transistor 16, while the collector is connected to capacitor 18, and resistor 20, with the capacitor 18 providing a path to ground for the I.F. signal yet permitting the audio frequency signals to pass to the resistor 20 providing a load for transistors 14 and 16 and is the point at which the audio signal is relayed through audio coupling capacitor 22 to the audio amplifier 24, after the audio signal is developed by transistors 14 and 16. The base of transistor 14 is connected through resistor 26 and capacitor 28 to ground while transistor 16 is connected to ground through resistor 30 and capacitor 32. Resistor 26 and capacitor 28 provide the necessary load and bias to transistor 14, while resistor 30 and capacitor 32 provide a load and bias for transistor 16 in addition to establishing a time constant for the circuit.

The emitter of transistor 16 is connected through the variable potentiometer 34 to the emitter of transistor 36, with the transistor being placed in a mixer or first I.F. stage as is represented at 37. Potentiometer 34 is used to set the voltage at resistor 46 and also to set the level of the I.F. stages. Resistors 38 and 40 are connected to the base of transistor 36 and are provided to establish a conventional voltage divider at the base so that voltage impressed on the base, will remain at a pre-set value. Resistor 46 capacitor 48 establishes a reference point for the current through transistor 36.

A conventional tank circuit comprised of parallel connected capacitor 44 and inductor coil 42 is connected between the collector of transistor 36 and power supply switch 109. Coil 42 is inductively coupled in conventional fashion to the input of the I.F. stages shown at block 11. A coupling capacitor 62 acts to prevent D.C. signals from passing to the I.F. stages.

In operation, an A.C. signal from the final I.F. stage 11 is passed through capacitor 12 to transistor 14 where the A.C. signal is rectified and amplified, wherein the signal established by transistor 14 changes the voltage across resistor 30 by the amount of the gain which has been established by transistor 14, which causes transistor 16 to amplify the current by an amount gained by the transistor 16. The effect of transistor 14 causing transistor 16 to conduct a total gain equal to the product of the gains of both transistors. Therefore, if there were, for example, a gain of 50 in each transistor, the total gain would equal 2500. The current conducted by transistors 14 and 16 is supplied to variable potentiometer 34 and resistor 46 which provide a change in voltage drop across resistor 46 effecting a change in current through transistor 36 causing the transistor to conduct less thereby varying the gain of transistor 36, thereby affecting the gain of the I.F. stages represented by block 11. Thus, the automatic gain control circuit begins to work at the signal-to-noise ratio of 1/1, resulting in a dynamic range of 100 db when applying a suitable voltage across resistor 46.

In summary there has been disclosed an automatic gain control circuit, which starts controlling a signal, at noise and continues to effectively control the gain of this signal for 100 db of dynamic range.

Obviously many modifications and variations of the present invention are possible in the light of the above teachings. It is therefore to be understood, that within the scope of the appended claims, the invention may be practiced otherwise than as specifically described.

What is claimed is:

1. In an automatic gain control system for detecting and amplifying an I.F. frequency signal, the combination including:

a first transistor having a base, emitter and collector, a second transistor having a base, emitter and collector, said second transistor being connected to said first transistor such that the current of the emitter of said second transistor is the product of the current at the emitter of the first transistor times the gain of said second transistor, a first I.F. stage including a control element electrically associated therewith, at least one additional I.F. stage having the base of said first transistor connected to the output of said additional I.F. stage for receiving an A.C. signal therefrom, the input of said additional I.F. stage being connected to the output of said first I.F. stage, and a variable resistance means connected at one of its ends to the emitter of said second transistor and being connected at its other end to the control element of said first I.F. stage whereby when minimum detectable signals are received from the I.F. stages the gain thereof is controlled over a large dynamic range by the operation of said first and second transistor arrangement, the overall arrangement acting to provide a simple, troublefree A.G.C. circuit for use in detecting solar noise from an antenna input.

2. The device as defined in claim 1, further including:

a first resistor and capacitor connected in series between the base of said first transistor and ground, the junction between said first resistor and capacitor being connected to the emitter of said transistor to form a bias and load, for said first transistor, and a second resistor and capacitor connected together at ground, the other end of said second resistor being connected to the emitter of said first transistor and the base of said second transistor, the other end of said second capacitor being connected to the emitter of said second transistor.

3. The device as defined in claim 1, further including:

a capacitor connected between a junction of the collector of said first and second transistors and ground whereby the I.F. signals from said transistors is passed to ground.

4. The device as defined in claim 1 wherein the first I.F. stage includes:

a third transistor having a base, emitter and collector, the emitter of said third transistor being connected to said variable resistance means, an impedance circuit connected between the emitter of said third transistor and ground, a power source terminal, a tank circuit connected between the collector of said third transistor and said power source terminal, and a voltage divider network connected between said power source terminal and ground, and with a point intermediate said network being connected to the base of said third transistor.

References Cited by the Examiner

UNITED STATES PATENTS

| | | | |
|---|---|---|---|
| 3,021,489 | 2/1962 | Nielsen | 330—29 |
| 3,154,740 | 10/1964 | Eness | 325—410 X |
| 3,202,924 | 8/1965 | Myers et al. | 330—29 X |
| 3,218,568 | 11/1965 | Dowhy | 330—29 |

KATHLEEN H. CLAFFY, *Primary Examiner.*

R. LINN, *Assistant Examiner.*